(12) United States Patent
Sotoyama et al.

(10) Patent No.: US 6,803,126 B2
(45) Date of Patent: Oct. 12, 2004

(54) ORGANIC EL ELEMENT AND ORGANIC EL DISPLAY

(75) Inventors: Wataru Sotoyama, Kawasaki (JP); Hiroyuki Sato, Kawasaki (JP); Azuma Matsuura, Kawasaki (JP); Toshiaki Narusawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/270,200

(22) Filed: Oct. 15, 2002

(65) Prior Publication Data
US 2003/0186081 A1 Oct. 2, 2003

(30) Foreign Application Priority Data
Mar. 15, 2002 (JP) .......................................... 2002-071525

(51) Int. Cl.[7] .............................................. H05B 33/14
(52) U.S. Cl. ....................... 428/690; 428/917; 313/504; 313/506; 257/88
(58) Field of Search ................................ 428/690, 917; 313/504, 506; 257/88

(56) References Cited

U.S. PATENT DOCUMENTS 6,358,633 B1    3/2002   Sano et al.

FOREIGN PATENT DOCUMENTS

| JP | 5-32596 | 2/1993 |
|---|---|---|
| JP | 5-190283 | 7/1993 |
| JP | 5-194943 | 8/1993 |
| JP | 5-222361 | 8/1993 |
| JP | 6-136359 | 5/1994 |
| JP | 6-140156 | 5/1994 |
| JP | 6-219973 | 8/1994 |
| JP | 7-101911 | 4/1995 |
| JP | 07-110940 | 4/1995 |
| JP | 7-282975 | 10/1995 |
| JP | 8-259940 | 10/1996 |
| JP | 9-188874 | 7/1997 |
| JP | 10-67984 | 3/1998 |
| JP | 10-88122 | 4/1998 |
| JP | 10-255985 | 9/1998 |
| JP | 10-289786 | 10/1998 |
| JP | 11-87057 | 3/1999 |
| JP | 11-185962 | 7/1999 |
| JP | 11-199864 | 7/1999 |
| JP | 11-214152 | 8/1999 |
| JP | 11-273864 | 10/1999 |
| JP | 11-329719 | 11/1999 |
| JP | 11-354283 | 12/1999 |
| JP | 2000-26337 | 1/2000 |
| JP | 3046814 B | 5/2000 |
| JP | 2000-136379 | 5/2000 |
| JP | 2000-164363 | 6/2000 |
| JP | 3099497 B | 8/2000 |
| JP | 200-231987 | 8/2000 |
| JP | 2000-212466 | 8/2000 |
| JP | 2000-243575 | 9/2000 |
| JP | 2000-273056 | 10/2000 |
| JP | 2001-3044 | 1/2001 |
| JP | 2001-23778 | 1/2001 |
| JP | 2001-52861 | 2/2001 |
| JP | 2001-64529 | 3/2001 |
| JP | 2001-89681 | 4/2001 |
| JP | 2001-102172 | 4/2001 |
| JP | 2001-102174 | 4/2001 |
| JP | 2001-118682 | 4/2001 |
| JP | 2001-126874 | 5/2001 |
| JP | 2001-131541 | 5/2001 |

OTHER PUBLICATIONS

C.W. Tang and S.A. VanSlyke, "Organic electroluminescent diodes", *Applied Physics Letters* vol. 51(12), pp. 913–915, Sep. 1987.

C.W. Tang, S.A. VanSlyke, and C.H. Chen, "Electroluminescence of doped organic thin films", *Journal of Applied Physics* vol. 65(9), pp. 3610–3616, May 1989.

Primary Examiner—Marie Yamnitzky
(74) Attorney, Agent, or Firm—Westerman, Hattori, Daniels & Adrian, LLP

(57) ABSTRACT

An organic EL element having excellent light-emitting efficiency, light-emitting luminance and color purity of blue light having an organic thin film layer interposed between a positive electrode and a negative electrode, and containing a 1,3,6,8-tetrasubstituted pyrene compound expressed by the following structural formula (1) as a light-emitting material;

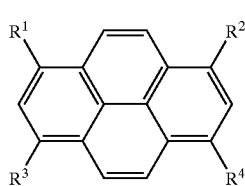

(1)

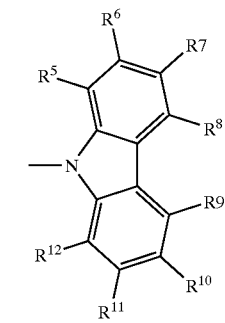

(2)

$R^1$ to $R^4$ may be identical or different, and represent substituent groups expressed by the formula (2), in which $R^5$ to $R^{12}$ may be identical or different, and represent a hydrogen atom or substituent group.

15 Claims, 3 Drawing Sheets

… (1)

ORGANIC EL ELEMENT AND ORGANIC EL DISPLAY

CROSS-REFERENCE TO RELATED APPLICATIONS

This application is based upon and claims the benefit of priority from the prior Japanese Patent Application No. 2002-71525, filed on Mar. 15, 2002, the entire contents of which are incorporated herein by reference.

BACKGROUND OF THE INVENTION

1. Field of the Invention

The present invention relates to an organic EL element, and to an organic EL display using the same.

2. Description of the Related Art

Organic EL elements have features such as spontaneous light emission, high-speed response, and the like, and they are expected to be applied to flat panel displays. A two-layer (laminated) organic thin film having positive hole transport properties (positive hole transporting layer) and organic thin film having electron transport properties (electron transporting layer) having electron transport properties has been reported (C. W. Tang and S. A. VanSlyke, *Applied Physics Letters* vol.51, p.913 (1987)), and due to its large area light-emitting element which emits light at a low voltage of 10V or less, it has recently been attracting attention. Organic EL elements of the laminated type have the basic construction, positive electrode/positive hole transporting layer/light-emitting layer/electron transporting layer/negative electrode, wherein the functions of the positive hole transporting layer or electron transporting layer may be added to that of the light-emitting layer as in the two-layer type.

It is expected that organic EL elements will soon be applied to full color displays. In this full color display, it is necessary to have pixels emitting light of three primary colors, blue (B), green (G) and red (R) arranged on the panels. There are three methods for achieving such arrangement;

(a) providing three types of organic EL elements, blue (B), green (G), red (R),
(b) separating the light emission light from an organic EL element emitting white light (which is a mixture of blue (B), green (G) and red (R) light) by color filters, and
(c) converting the light emission from an organic EL element emitting blue light into green (G) and red (R) light emission by a color conversion layer using fluorescent light.

In all of these systems, blue (B) light emission is indispensable.

Since the luminescence color in an organic EL element is determined by the unique excitation energy of the light-emitting molecule, in order to obtain blue (B) light emitting, a light-emitting molecule which has an excitation energy corresponding to the optical energy of blue light is needed. Moreover, in order to obtain a high quality full color display, the blue light emission organic EL element used for it must have high luminance, high efficiency and high color purity.

However, the characteristics of the blue light-emitting organic EL elements of the related art could not be said to have sufficient light-emitting luminance, light-emitting efficiency, color purity, and the like, hence further improvements were required.

SUMMARY OF THE INVENTION

It is therefore an object of the present invention to provide an organic EL element having excellent light-emitting efficiency, light-emitting luminance and color purity of blue light, and a highly efficient organic EL display using this organic EL element.

The organic EL element of the present invention comprises a specific 1,3,6,8-tetrasubstituted pyrene compound as light-emitting material.

An organic EL display of the present invention comprises an organic EL element of the present invention.

DESCRIPTION OF THE PREFERRED EMBODIMENTS

<Organic EL Element>

Figure 1:
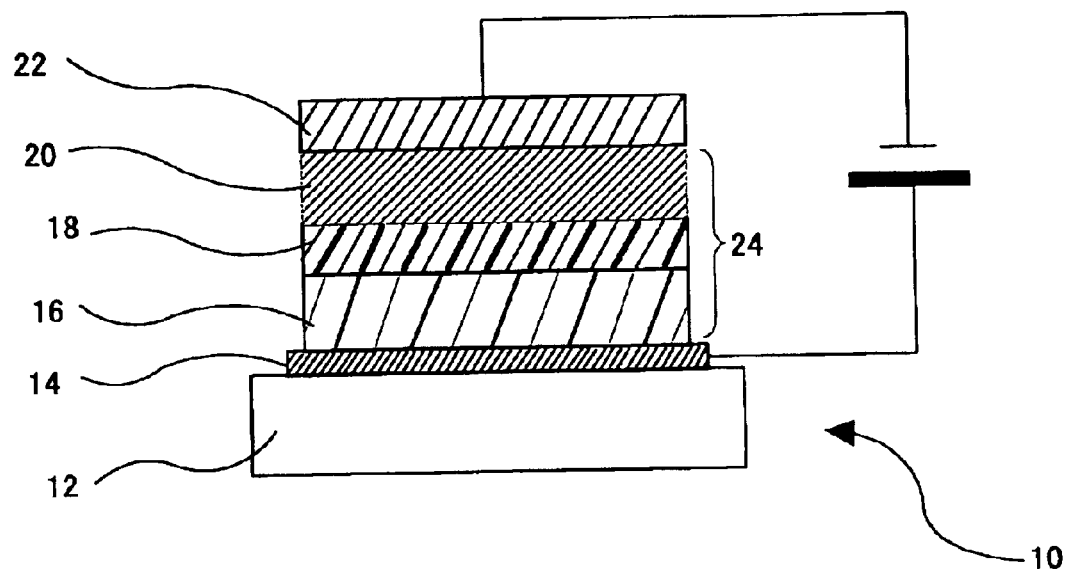
FIG. 1 is a schematic explanatory view describing an example of the layer composition in an organic EL element according to the present invention.

The organic EL element of the present invention comprises an organic thin film layer between a positive electrode and a negative electrode, this organic thin film layer comprising a 1,3,6,8-tetrasubstituted pyrene compound expressed by the following structural formula (1) as a light-emitting material.

Structural formula (1)

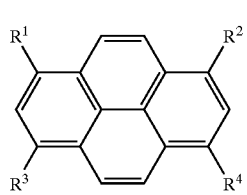

In the structural formula (1), $R^1$ to $R^4$ may be identical or different, and represent a substituent group expressed by the following structural formula (2).

Structural formula (2)

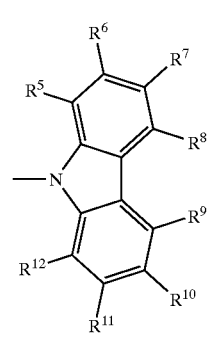

In the structural formula (2), $R^5$ to $R^{12}$ may be identical or different, and represent a hydrogen atom or a substituent group. If $R^5$ to $R^{12}$ are all hydrogen atoms, the manufacture of this 1,3,6,8-tetrasubstituted pyrene compound is simple and it is easily obtained.

Examples of the substituent group are alkyl groups, aryl groups, and the like. These may be substituted by substituent groups. There is no particular limitation on this substituent group. The substituent group can be selected from known groups according to the object.

There is no particular limitation on the alkyl groups. These can be selected according to the object. Examples are straight chain, branched or cycloalkyl groups having 1 to 10 carbon atoms. Specific examples suitably include methyl, ethyl, propyl, isopropyl, butyl, isobutyl, tertiary butyl, pentyl, isopentyl, hexyl, isohexyl, heptyl, isoheptyl, octyl, iso octyl, nonyl, isononyl, decyl, isodecyl, cyclopentyl, cyclobutyl, cyclopentyl, cyclohexyl, cycloheptyl, cyclooctyl, cyclononyl, cyclodecyl, and the like.

There is no particular limitation on this aryl group which can be suitably selected according to the purpose, for example, monocyclic aromatic rings, groups comprising up to 4 aromatic rings bonded together and groups comprising up to 5 aromatic rings bonded together and also comprising up to 50 carbons consisting of oxygen atoms, nitrogen atoms, and sulfur atoms.

There is no particular limitation on the monocyclic aromatic ring which can be suitably selected according to the purpose. Examples of the monocyclic aromatic ring include phenyl, tolyl, xylyl, cumyl, styryl, mesityl, cinnamyl, phenethyl, benzhydryl, and the like. These may be substituted by substituent groups.

There is no particular limitation on the groups comprising up to four aromatic rings. The groups can be selected according to the purpose. Examples include naphthyl, anthryl, phenanthryl, indenyl, azulenyl or benzanthracenyl, and the like. These may be substituted by substituent groups.

There is no particular limitation on the group comprising up to 5 bonded aromatic rings and also comprising up to 30 carbons consisting of oxygen atoms nitrogen atoms and sulfur atoms, and they can be suitably selected according to the purpose. Examples of the groups include pyrrorylyl, furyl, thienyl, pyridyl, quinolyl, isoquinolyl, imidazoyl, pyridinyl, pyrrolo pyridinyl, thiazoyl, pyrimidinyl, thiophenyl, indolyl, quinolinyl, pyrynyl, adenyl, and the like. These may be substituted by substituent groups.

In the present invention, the above 1,3,6,8-tetrasubstituted pyrene compound is contained in the organic thin film layer as a light-emitting material, but it may also be contained in the light-emitting layer in this organic thin film layer, or may also be contained in the light-emitting layer and electron transporting layer, light-emitting layer, electron hole transportation layer, and the like. In the case where the above 1,3,6,8-tetrasubstituted pyrene compound is contained in the light-emitting layer, the light-emitting layer may be formed only with the 1,3,6,8-tetrasubstituted pyrene compound, or with materials in addition to the 1,3,6,8-tetrasubstituted pyrene compound.

It is preferred that the light-emitting layer contains the carbazole derivative expressed by the following structural formula (3) in addition to the above 1,3,6,8-tetrasubstituted pyrene compound. It is preferred that this carbazole derivate is contained in the light-emitting layer, but it may be contained in the electron transporting layer or electron hole transport layer in the organic thin film layer.

When the light-emitting layer contains the carbazole derivative, the 1,3,6,8-tetrasubstituted pyrene compound functions as a guest material, and the carbazole derivative functions as a host material. Namely, the optical absorption wavelength of the 1,3,6,8-tetrasubstituted pyrene compound is 330 nm to 400 nm, and the main light-emitting wavelength of the carbazole derivative approximately overlaps with the optical absorption wavelength of the 1,3,6,8-tetrasubstituted pyrene compound (for example, the main light-emitting wavelength of 4,4'-bis(9-carbazolyl)-biphenyl (CBP) is 380 nm). Among the carbazole derivatives, in the case of 4,4'-bis(9-carbazolyl)-biphenyl (CBP), for example, the optical absorption wavelength is at shorter wavelength than that of the 1,3,6,8-tetrasubstituted pyrene compound, and its light-emitting wavelength is in the vicinity of the optical absorption wavelength of the 1,3,6,8-tetrasubstituted pyrene compound. If overlapping materials are contained in the light-emitting layer, excitation energy moves efficiently from the excited aforesaid host material (4,4'-bis(9-carbazolyl)-biphenyl (CBP)) to the guest material (1,3,6,8-tetrasubstituted pyrene compound). The host material returns to its base state without emitting light, and only the guest material (1,3,6,8-tetrasubstituted pyrene compound) emits excitation energy as blue light. This is advantageous from the viewpoint of excelling in light-emitting efficiency, light-emitting luminance, color purity of blue light, and the like.

In general, when a light-emitting molecule is present alone or at high concentration in a thin film, a mutual interaction occurs between the light-emitting molecules. As light-emitting molecules approach each other, light-emitting efficiency decreases; this is called "concentration quenching". In the light-emitting layer, as the 1,3,6,8-tetrasubstituted pyrene compound which is the guest compound is distributed at relatively low concentration in the carbazole derivative which is the host compound, the above "concentration quenching" is effectively suppressed, and the light-emitting efficiency becomes excellent.

Further, as the carbazole derivative has excellent film-forming properties, so the light-emitting layer has excellent film-forming properties while maintaining light emission characteristics.

Structural formula (3)

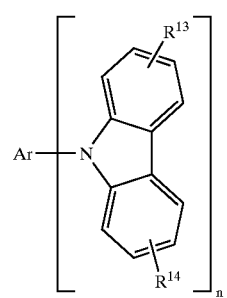

In the structural formula (3), Ar represents a bifunctional or trifunctional group containing an aromatic ring, or a bifunctional or a trifunctional group containing a heterocyclic aromatic group. The following bifunctional or trifunctional aromatic groups or heterocyclic aromatic groups expressed in the general formula (1) may be suitably mentioned.

General formula (1)

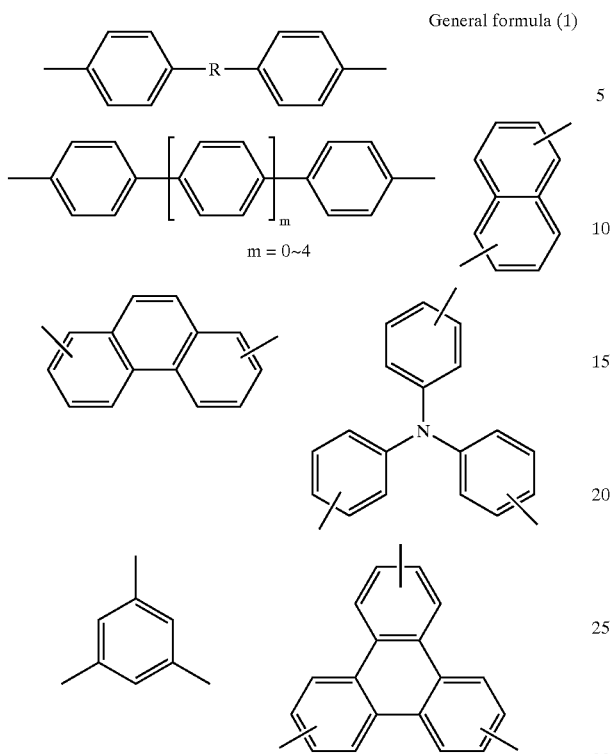

These may be substituted by non-conjugated groups. R represents a linking group, and for example, the following are suitable.

Chemical formula (1)

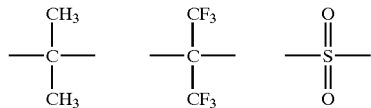

In the structural formula (3), $R^{13}$ and $R^{14}$ may be identical or may differ from each other, and may represent a hydrogen atom or a substituent group. Examples of the substituent group are a halogen atom, an alkyl group, an alkylsulfonyl group, an aralkyl group, an alkenyl group, a hydroxyl group, a cyano group, an amine group, an amide group, an acyl group, a carboxyl group, an alkoxy group, an alkoxycarbonyl group, an aryl group, an aryloxy group, an aromatic hydrocarbon group or an aromatic heterocyclic group and the like. These may be further substituted by substituent groups. n represents an integer, for example, 2 or 3.

In the structural formula (3), Ar is an aromatic group wherein two benzene rings are connected by a single bond, $R^{13}$, $R^{14}$ are hydrogen atoms, and n=2. Namely, it is preferred that the 4,4'-bis (9-carbazolyl)-biphenyl (CBP) expressed by the following structural formula (4) has particularly excellent light-emitting efficiency, light-emitting luminance and color purity of blue light.

Structural formula (4)

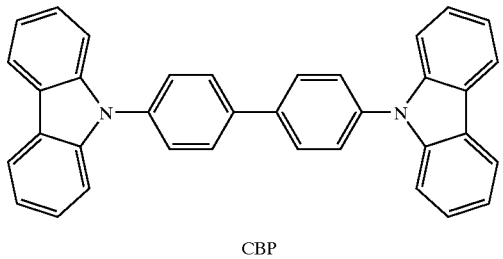

CBP

As long as it does not interfere with the effect of the present invention, the light-emitting layer may contain each carbazole derivative solely or a combination of two or more carbazole derivatives, and may also contain one, two or more host materials in addition to this carbazole derivative.

The content of 1,3,6,8 tetrasubstituted pyrene compound in the layer containing the 1,3,6,8-tetrasubstituted pyrene compound expressed by the structural formula (1) is preferably 0.1% by mass to 50% by mass, and more preferably 0.5% by mass to 20% by mass When this content is below 0.1% by mass, coloring efficiency, coloring luminosity and color purity may not be sufficient, and if it exceeds 50% by mass, color purity may deteriorate. On the other hand, coloring efficiency, coloring luminosity and color purity are excellent within the above preferred range.

In the light-emitting layer in the organic EL element of the present invention, a positive hole can be introduced from the positive electrode, electrons can be introduced from the positive hole injecting layer, the positive hole transporting layer, the negative electrode, the electron implantation layer, the electron transporting layer and the like, while applying an electric field. An area may be provided for recombination between holes and electrons, and the 1,3,6,8-tetrasubstituted pyrene compound (light-emitting material, light-emitting molecule) made to emit blue light due to the recombination energy produced at this time. In addition to the 1,3,6,8-tetrasubstituted pyrene compound, other light-emitting materials may be added to the extent that they do not interfere with the blue light emission.

The light-emitting layer can be formed according to the known methods, for example, a vapor deposition method, a wet film forming method, an MBE (molecular beam epitaxy) method, a cluster ion beam method, a molecule laminating method, an LB method, a printing method, transfer method, and the like.

Of these, a vapor deposition method is preferred from the viewpoint that an organic solvent is not used, hence there is no problem of waste fluid treatment, and manufacturing is low cost, simple and efficient. In designing the light-emitting layer as a single layer structure, when, for example, forming this light-emitting layer as a positive hole transporting layer and light-emitting layer and electron transporting layer, the wet film forming method is also preferred.

There is no particular limitation on the vapor deposition method, which can be suitably selected from known methods according to the purpose, for example a vacuum vapor deposition method, a resistance heating vapor deposition method, a chemical vapor deposition method, a physical vapor deposition method, and the like. Examples of chemical vapor deposition are plasma CVD, laser CVD, heat CVD, gas source CV, and the like.

The light-emitting layer formed by a vapor deposition method may suitably be formed for example by vacuum deposition of 1,3,6,8-tetrasubstituted pyrene compound, or in the case where this light-emitting layer contains the carbazole derivative host material in addition to the above 1,3,6,8-tetrasubstituted pyrene compound, the 1,3,6,8-tetrasubstituted pyrene compound and this host material can be formed simultaneously by vacuum vapor deposition. In the former case, manufacture is easier as there is no need for co-deposition.

There is no particular limitation on the wet film forming method which can be suitably selected from known methods according to the purpose, for example an ink-jet method, a spin coat method, a kneader coat method, a bar coat method, a braid coat method, a cast method, a dip method, and a curtain coat method, and the like.

In the wet film forming method, a solution may be used (coated and the like) wherein the material of the light-emitting layer is dissolved or dispersed together with a resin component. Examples of this resin component are polyvinyl carbazole, polycarbonate, polyvinyl chloride, polystyrene, polymethyl methacrylate, polyester, polysulfone, polyphenylene oxide, polybutadiene, hydrocarbon resins, ketone resins, phenoxy resin, polyamide, ethyl cellulose, vinyl acetate, ABS resin, polyurethane, melamine resin, unsaturated polyester resin, alkyde resin, epoxy resin, silicone resin, and the like.

The light-emitting layer obtained by the wet film forming method may be formed, for example, by using (coating and drying) a solution (coating liquid) in which the 1,3,6,8-tetrasubstituted pyrene compound, and, if necessary, the resin material, are dissolved in a solvent. If this light-emitting layer contains the host material in addition to the 1,3,6,8-tetrasubstituted pyrene compound, the light emitting layer obtained by the wet film forming method may be formed by using (coating and drying) a solution (coating liquid) in which the 1,3,6,8-tetrasubstituted pyrene compound, the host material and, if necessary, the resin material are dissolved in a solvent.

The thickness of the light-emitting layer is preferably 1 nm to 50 nm, but more preferably 3 nm to 20 nm.

If the thickness of the light-emitting layer is within the above preferred numerical range, light-emitting efficiency, light-emitting luminance and color purity of the blue light emitted by this organic EL element are sufficient, and if it is within the more preferred numerical range, these effects are more pronounced.

The organic EL element of the present invention comprises an organic thin film layer containing a light-emitting layer interposed between an positive electrode and a negative electrode, but it may have other layers such as a protective layer and the like, according to the purpose.

The organic thin film layer comprises at least the light-emitting layer, and may also have an positive hole injecting layer, positive hole transporting layer, positive hole blocking layer, electron transporting layer, and the like as necessary.

—Positive Electrode—

There is no particular limitation on the positive electrode, which can be suitably selected according to the purpose. Specifically, when this organic thin film layer comprises only the light-emitting layer, it is preferred to supply positive holes (carrier) to this light-emitting layer; when this organic thin film layer further comprises a positive hole transporting layer, it is preferred to supply positive holes (carrier) to this positive hole transporting layer; and when this organic thin film layer further comprises a positive hole injecting layer, it is preferred to supply positive holes (carrier) to the positive hole injecting layer.

There is no particular limitation on the material of the positive electrode which can be suitably selected according to the purpose, for example metals, alloys, metal oxides, electrically conductive compounds and mixtures thereof. Among these, materials having a work function of 4 eV or more are preferred.

Specific examples of the material of the positive electrode are electrically conductive metal oxides such as tin oxide, zinc oxide, indium oxide, indium tin oxide (ITO) and the like, metals such as gold, silver, chromium, nickel, and the like mixtures or laminates of these metals and electrically conductive metal oxides, inorganic electrically conductive substances such as copper iodide and copper sulfide, and the like, organic electrically conductive materials such as polyaniline, polythiophene, polypyrrole, and the like, and laminates of these with ITO. These may be used alone, or two or more may be used in combination. Of these, electrically conductive metal oxides are preferred, and ITO is particularly preferred from the viewpoints of productivity, high conductivity and transparency.

There is no particular restriction on the thickness of the positive electrode which may be selected according to the material, but 1 nm to 5000 nm is preferred and 20 nm to 200 nm is more preferred.

The positive electrode is normally formed on a substrate such as a glass including a soda lime glass or a non-alkali glass, and the like, or a transparent resin.

When using the above-mentioned glass as the substrate, the non-alkali glass or the soda lime glass with a barrier coat of silica or the like, are preferred from the viewpoint that they lessen elution ions from the glass.

There is no particular limitation on the thickness of the substrate provided that it is sufficient to maintain mechanical strength, but when using glass as the substrate, the thickness is normally 0.2 mm or more, and 0.7 mm or more is preferred.

The positive electrode can be suitably formed by any of the methods mentioned above, such as the method of coating a dispersion of ITO by the vapor deposition method, wet film forming method, electron beam method, sputtering method, reactant sputtering method, MBE (molecular beam epitaxy) method, cluster ion beam method, ion plating method, plasma polymerization method (high frequency excitation ion plating method), molecule laminating method, LB method, printing method, transfer method, chemical reaction methods (sol gel process, and the like), and the like.

By washing the positive electrode and performing other treatment, the drive voltage of this organic EL element can be reduced, and the light-emitting efficiency can also be increased. Examples of other treatments, when the material of the positive electrode is ITO, include UV-ozonization and plasma processing, and the like.

—Negative Electrode—

There is no particular limitation on the negative electrode, which can be suitably selected according to the purpose. Specifically, when this organic thin film layer comprises only the light-emitting layer, it is preferred to supply electrons to this light-emitting layer; when this organic thin film layer further comprises an electron transporting layer, it is preferred to supply electrons to this electron transporting layer; and when there is an electron implantation layer between this organic thin film layer and the negative electrode, it is preferred to supply electrons to this electron implantation layer.

There is no particular limitation on the material of the negative electrode which can be suitably selected according to adhesion properties with the layers or molecules adjoining this negative electrode, such as the electron transporting layer, a light-emitting layer, and the like and according to ionization potential, and stability. Examples are metals, alloys, metal oxides, electrically conductive compounds and the like, as well as mixtures thereof.

Examples of the material of the negative electrode are alkali metals (for example, Li, Na, K, Cs, and the like), alkaline earth metals (for example, Mg, Ca, and the like), gold, silver, lead, aluminum, sodium-potassium alloys or their mixtures, lithium-aluminium alloys or their mixtures, magnesium-silver alloys or their mixtures, rare earth metals such as indium and ytterbium, their alloys, and the like.

These can be either alone or in combination of 2 or more. Of these, materials having a work function of 4 eV or less are preferred. More preferable examples include aluminium, lithium-aluminium alloys and their mixtures, and magnesium-silver alloys and their mixtures.

There is no particular limitation on the thickness of the negative electrode which may be selected according to the material of the negative electrode, but 1 nm to 10000 nm is preferred and 20 nm to 200 nm is more preferred.

The negative electrode can be suitably formed by any of the methods mentioned above, such as the vapor deposition method, wet film forming method, electron beam method, sputtering method, reactant sputtering method, MBE (molecular beam epitaxy) method, cluster ion beam method, ion plating method, plasma polymerization method (high frequency excitation ion plating method), molecule laminating method, LB method, printing method, transfer method, and the like.

When two or more of these are used together as the material of the negative electrode, two or more materials may be vapor-deposited simultaneously to form an alloy electrode, or a pre-prepared alloy may be made to vapor-deposit so as to form an alloy electrode.

The resistances of the positive electrode and negative electrode are preferably low, and it is preferred that they are several hundreds of $\Omega s/\square$ or less.

—Positive Hole Injecting Layer—

There is no particular restriction on the positive hole injecting layer which can be selected according to the purpose. It is preferred that it has the function of, for example, implanting positive holes from the positive electrode when an electric field is applied.

There is no particular limitation on the material of the positive hole injecting layer which can be suitably selected according to the purpose, e.g. a starburst amine (4,4',4"-tris[3-methylphenyl(phenyl)amino]triphenylamine:m-MTDATA) expressed by the following structural formula (5), copper phthalocyanine or polyaniline.

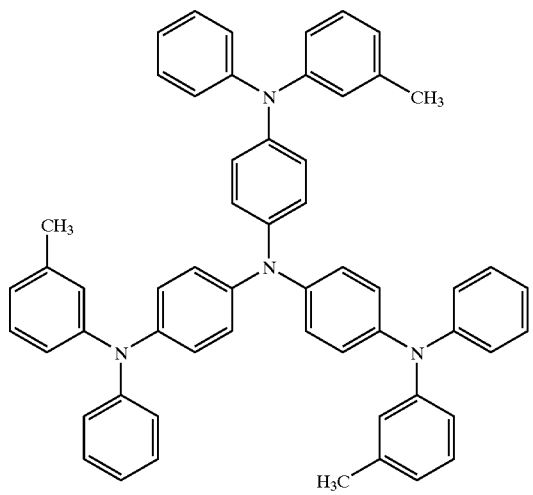

Structural formula (5)

There is no particular limitation on the thickness of the positive hole injecting layer which can be selected according to the purpose, e.g., about 1 nm to 100 nm is preferred, and 5 nm to 50 nm is more preferred.

The positive hole injecting layer can be suitably formed by any of the methods mentioned above, such as the vapor deposition method, wet film forming method, electron beam method, sputtering method, reactant sputtering method, MBE (molecular beam epitaxy) method, cluster ion beam method, ion plating method, plasma polymerization method (high frequency excitation ion plating method), molecule laminating method, LB method, printing method, transfer method, and the like.

—Positive Hole Transporting Layer—

There is no particular limitation on the positive hole transporting layer which can be selected according to the purpose. For example, a layer having the function to convey positive holes from the positive electrode when an electric field is applied, is preferred.

There is no particular limitation on the material of the positive hole transporting layer which can suitably be selected according to the purpose. Examples are electrically conductive oligomers such as aromatic amine compounds, carbazole, imidazole, triazole, oxazole, oxadiazole, polyarylalkane, pyrrazoline, pyrrazolone, phenylene diamine, arylamine, amine-substituted chalcone, styryl anthracene, fluorenone, hydrazone, stilbene, silazane, styryl amine, aromatic dimethylidene compounds, porphyrine compounds, polysilane compounds, poly(N-vinyl carbazole), aniline copolymers, and polymers, thiophene oligomers and polymers, polythiophene, carbon film, and the like. If the materials of the positive hole transporting layer are mixed with the material of the light emitting layer to form a film, a positive hole transporting layer/light emitting layer can be formed.

These may be used alone, or two or more may be used in combination. Of these, aromatic amine compounds are preferred. Specifically, TPD (N,N'-diphenyl-N,N'-bis(3-methylphenyl)-[1,1'-biphenyl]-4,4'-diamine) expressed by the following structural formula (6), and NPD (N,N'-dinaphthyl-N,N'-diphenyl-[1,1'-biphenyl]-4,4'-diamine) expressed by the following structural formula (7), are more preferred.

Structural formula (6)

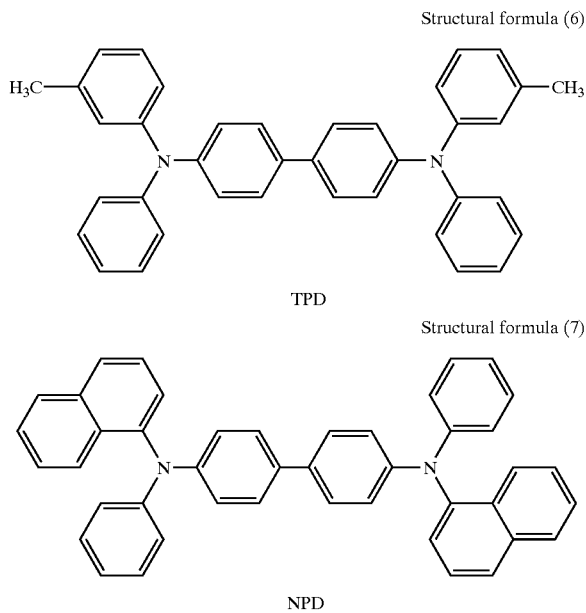

TPD

Structural formula (7)

NPD

There is no particular limitation on the thickness of the positive hole transporting layer which may be selected according to the purpose, but normally 1 nm to 500 nm is preferred, and 10 nm to 100 nm is more preferred.

The positive hole transporting layer can be suitably formed by any of the methods mentioned above, such as the vapor deposition method, wet film forming method, electron beam method, sputtering method, reactant sputtering method, MBE (molecular beam epitaxy) method, cluster ion beam method, ion plating method, plasma polymerization method (high frequency excitation ion plating method), molecule laminating method, LB method, printing method, transfer method, and the like.

—Positive Hole Blocking Layer—

There is no particular limitation on the positive hole blocking layer which may be selected according to the purpose. However, a layer having, for example, the function of a barrier to positive holes implanted from the positive electrode, is preferred.

There is no particular limitation on the material of the positive hole blocking layer which can be suitably selected according to the purpose.

If the organic EL element comprises a positive hole blocking layer, positive holes conveyed from the positive electrode side are blocked by the positive hole blocking layer, and electrons conveyed from the negative electrode are transmitted through the positive hole blocking layer to reach the light-emitting layer. Hence, recombination of electrons and positive holes occurs efficiently in this light-emitting layer, and recombination of positive holes and electrons in organic thin film layers other than this light-emitting layer can be prevented. Thus, the luminescence from the 1,3,6,8-tetrasubstituted pyrene compound which is the aimed luminescent material is obtained efficiently, and this is advantageous in respect of color purity.

The positive hole blocking layer is preferably disposed between the light-emitting layer and the electron transporting layer.

There is no particular limitation on the thickness of the positive hole blocking layer which can be suitably selected according to the purpose. For example it is usually about 1 nm to 500 nm, but 10 nm to 50 nm is preferred.

The positive hole blocking layer may be a single layer structure, or may also be a laminated structure.

The positive hole blocking layer can be suitably formed by any of the methods mentioned above such as a vapor deposition method, a wet film forming method, a electron beam method, a sputtering method, a reactant sputtering method, an MBE (molecular beam epitaxy) method, a cluster ion beam method, an ion plating method, a plasma polymerization method (high frequency excitation ion plating method), a molecule laminating method, an LB method, a printing method, a transfer method, and the like.

—Electron Transporting Layer—

There is no particular limitation on the electron transporting layer which may suitably be selected according to the purpose, but for example a layer having the function to convey electrons from the negative electrode, or the function to act as a barrier to positive holes implanted from the positive electrode, is preferred.

There is no particular limitation on the material of the electron transporting layer, and may be suitably selected according to the purpose. Examples include 2,9-dimethyl-4,7-diphenyl-1,10-phenanthroline (bathocuproine, BCP) expressed by the following structural formula (8), quinoline derivatives, such as organic metal complexes having 8-quinol or a derivative thereof as ligand, for example, tris(8-hydroxyquinolinato) aluminum (Alq) expressed by the following structural formula (9), oxadiazole derivatives, triazole derivatives, phenanthroline derivatives, perylene derivatives, pyridine derivatives, pyrimidine derivatives, quinoxaline derivatives, diphenylquinone derivatives, nitro-substituted fluorophene derivatives, and the like. Also, if the material of the electron transporting layer is mixed with the material of the light-emitting layer to form a film, an electron transporting layer/light-emitting layer can be formed. If the material of a positive hole transporting layer is further mixed to form a film, an electron transporting layer/positive hole transporting layer/light-emitting layer can be formed. In this case, polymers such as polyvinyl carbazole, polycarbonate, and the like can be used.

Structural formula (8)

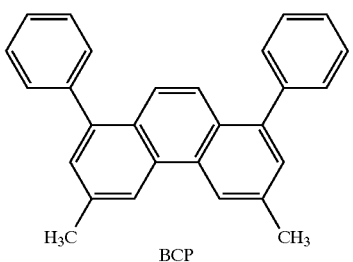

BCP

Aluminum Quinoline Complex (Alq)

Structural formula (9)

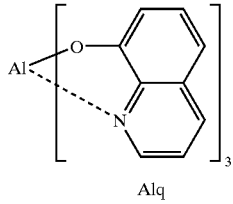

Alq

There is no particular limitation on the thickness of the electron transporting layer which can be suitably selected according to the purpose, for example it is usually about 1 nm to 500 nm, but preferably 10 nm to 50 nm.

The electron transportation layer may be a single layer structure, or may be a laminated structure.

In this case, regarding the electron transport material used for this electron transporting layer adjacent to the light-emitting layer, the use of an electron transport material whose optical absorption end is at shorter wavelength than that of the 1,3,6,8-tetrasubstituted pyrene compound, limits the light-emitting region in the organic EL element to the light-emitting layer, and prevents excessive light emission from the electron transporting layer. Examples of electron transport materials whose optical absorption end is at shorter wavelength than that of the 1,3,6,8-tetrasubstituted pyrene compound are phenanthroline derivatives, oxadiazole derivatives and triazole derivatives, and the like. Suitable examples of the compounds are shown below.

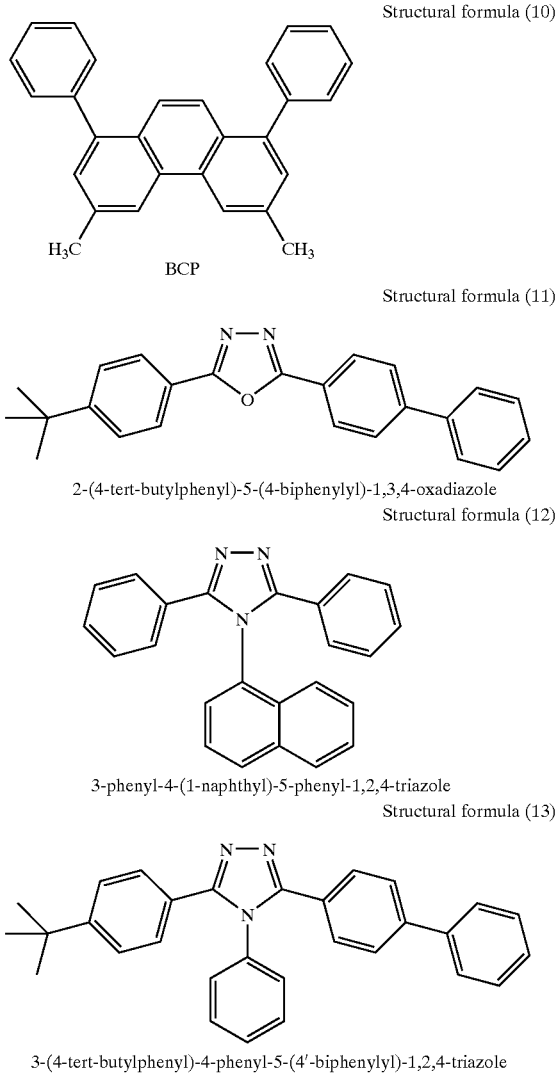

Structural formula (10)

BCP

Structural formula (11)

2-(4-tert-butylphenyl)-5-(4-biphenylyl)-1,3,4-oxadiazole

Structural formula (12)

3-phenyl-4-(1-naphthyl)-5-phenyl-1,2,4-triazole

Structural formula (13)

3-(4-tert-butylphenyl)-4-phenyl-5-(4'-biphenylyl)-1,2,4-triazole

The electron transporting layer can be suitably formed by any of the methods mentioned above, such as a vapor deposition method, a wet film forming method, an electron beam method, a sputtering method, a reactant sputtering method, an MBE (molecular beam epitaxy) method, a cluster ion beam method, an ion plating method, a plasma polymerization method (high frequency excitation ion plating method), a molecule laminating method, an LB method, a printing method, a transfer method, and the like.

—Other Layers—

The organic EL element of the present invention may have other layers which are suitably selected according to the purpose. Examples include a protective layer, and the like.

There is no particular limitation on the protection layer which may be suitably selected according to the purpose. For example, a layer which can prevent molecules or substances which promote deterioration of the organic EL element, such as moisture and oxygen, from penetrating the organic EL element, is preferred.

Examples of the material of the protection layer are metals such as In, Sn, Pb, Au, Cu, Ag, Al, Ti, Ni, and the like, metal oxides such as MgO, SiO and $SiO_2$, $Al_2O_3$, GeO, NiO, CaO, BaO, $Fe_2O_3$, $Y_2O_3$, $TiO_2$, and the like, nitrides such as SiN, $SiN_xO_y$, and the like, metal fluorides such as $MgF_2$, LiF, $AlF_3$, $CaF_2$, polyethylene, polypropylene, polymethyl methacrylate, polyimide, polyurea, polytetrafluoroethylene, polychlorotrifluoroethylene, polydichlorodifluoroethylene, the copolymer of chlorotrifluoroethylene and dichlorodifluoroethylene, copolymers obtained by copolymerizing a monomer mixture comprising tetrafluoroethylene and at least one comonomer, fluorine-containing copolymers having a ring structure in the copolymer main chain, water-absorbing substances having a water absorption rate of 1% or more, and dampproof substances having a water absorption rate of 0.1% or less.

The protection layer can be suitably formed by any of the methods mentioned above such as a vapor deposition method, a wet film forming method, a sputtering method, a reactant sputtering method, an MBE (molecular beam epitaxy) method, a cluster ion beam method, an ion plating method, a plasma polymerization method (a high frequency excitation ion plating method), a printing method, a transfer method, and the like.

There is no particular limitation on the structure of the organic EL element of the present invention which may be selected according to the purpose, i.e., the following layer compositions (1) to (13):

(1) Positive electrode/positive hole injecting layer/positive hole transporting layer/light-emitting layer/electron transporting layer/electron implantation layer/negative electrode, (2) Positive electrode/positive hole injecting layer/positive hole transporting layer/light-emitting layer/electron transporting layer/negative electrode, (3) Positive electrode/positive hole transporting layer/light-emitting layer/electron transporting layer/electron implantation layer/negative electrode, (4) Positive electrode/positive hole transporting layer/light-emitting layer/electron transporting layer/negative electrode, (5) Positive electrode/positive hole injecting layer/positive hole transporting layer/light-emitting layer and electron transporting layer/electron implantation layer/negative electrode (6) Positive electrode/positive hole injecting layer/positive hole transporting layer/light-emitting layer and electron transporting layer/negative electrode, (7) Positive electrode/positive hole transporting layer/light-emitting layer and electron transporting layer/electron implantation layer/negative electrode, (8) Positive electrode/positive hole transporting layer/light-emitting layer and electron transporting layer/negative electrode, (9) Positive electrode/positive hole injecting layer/positive hole transporting layer and light-emitting layer/electron transporting layer/electron implantation layer/negative electrode

(10) Positive electrode/positive hole injecting layer/positive hole transporting layer and light-emitting layer/electron transporting layer/negative electrode,
(11) Positive electrode/positive hole transporting layer and light-emitting layer/electron transporting layer/electron implantation layer/negative electrode,
(12) Positive electrode/positive hole transporting layer and light-emitting layer/electron transporting layer/negative electrode,
(13) Positive electrode/positive hole transporting layer and light-emitting layer and electron transporting layer/negative electrode.

When the organic EL element has a positive hole blocking layer, a layer composition in which the positive hole blocking layer is interposed between the light-emitting layer and electron transporting layer in the configuration (1) to (13) presented above may also be suitable.

Of these layer compositions, the aspect (4), positive electrode/positive hole transporting layer/light-emitting layer/electron transporting layer/negative electrode, is shown in FIG. 1. An organic EL element 10 has a layer composition comprising an positive electrode 14 (for example, ITO electrode) formed on a glass substrate 12, a positive hole transporting layer 16, a light-emitting layer 18, an electron transporting layer 20, and a negative electrode 22 (for example, Al—Li electrode) laminated in this order. The positive electrode 14 (for example, ITO electrode) and the negative electrode 22 (for example, Al—Li electrode) are interconnected through the power supply. An organic thin film layer 24 which emits blue light is formed by the positive hole transporting layer 16, light-emitting layer 18 and electron transporting layer 20.

The color emission wavelength of the organic EL element of the present invention is preferably 400 nm to 500 nm.

From the viewpoint of light-emitting efficiency of the organic EL element of the present invention, it is preferred that it emits blue light at a voltage of 10V or less, more preferred that it emits blue light at a voltage of 7V or less, and still more preferred that it emits blue light at a voltage of 5V or less.

It is preferred that, at an applied voltage of 10V, the light-emitting luminance of the organic EL element of the present invention is 100 cd/m$^2$ or more, more preferred that it is 500 cd/m$^2$ or more, and particularly preferred that it is 1000 cd/m$^2$ or more.

The organic EL element of the present invention is especially useful in various fields such as computers, on-vehicle display devices, field display devices, home apparatuses, industrial apparatus, household electric appliances, traffic display devices, clock display devices, calendar display units, luminescent screens, audio equipment, and the like. It is particularly convenient for the organic EL display of the present invention, described below.

<Organic EL Display>

There is no particular limitation on the organic EL display of the present invention which can be selected from those known composition, except that it uses the organic EL element of the present invention.

The organic EL display may emit blue monochrome light, may emit multi-color light, or may emit a full color type.

The organic EL display may be made a full color type as disclosed in *Japan Display Monthly,* September 2000, pages 33–37, i.e., the three color light emitting method wherein organic EL elements which emit light respectively corresponding to the three primary colors (blue (B), green (G), red (R)) are disposed on a substrate, the white method wherein white light from an organic EL element for white light emission is divided into the three primary colors via color filters, and the color conversion method wherein blue light emitted by an organic EL element which emits blue light is converted into red (R) and green (G) via a fluorescent pigment layer. In the present invention, as the organic EL element of the invention emits blue light, the three color light emitting method and color conversion method can be used, the three color light emitting method being particularly suitable.

In manufacturing the full color organic EL display by the three color light emitting method, an organic EL element for red light emission and organic EL element for green light emission are required in addition to the organic EL element for blue light emission of the present invention.

There is no particular limitation on the organic EL element for red light emission which can be selected from any known organic EL elements. For example, the layer composition is expressed by ITO (positive electrode)/NPD/DCJTB expressed by the following structural formula (14), 1% aluminum quinoline complex (Alq)/Alq/AL—Li (negative electrode). The DCJTB is 4-dicyanomethylene-6-cp-julolidinostyryl-2-tert-butyl-4 H-pyran. The Alq is as shown above.

Structural formula (14)

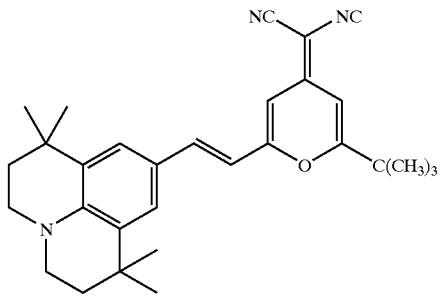

DCJTB
4-dicyanomethylene-6-cp-julolidinostyryl-
2-tert-butyl-4H-pyran

There is no particular limitation on the organic EL element for green light emission which can be selected from any known organic EL elements, and for example the layer composition may be expressed by ITO (positive electrode)/NPD/dimethyl quinacridone 1% the Alq/the Alq/AL—Li (negative electrode).

There is no particular limitation on the organic EL display which may be selected according to the purpose, but the passive matrix panel and active matrix panel disclosed by *Nikkei Electronics,* No. 765, Mar. 13, 2000, pages 55–62 are suitable.

Figure 2:
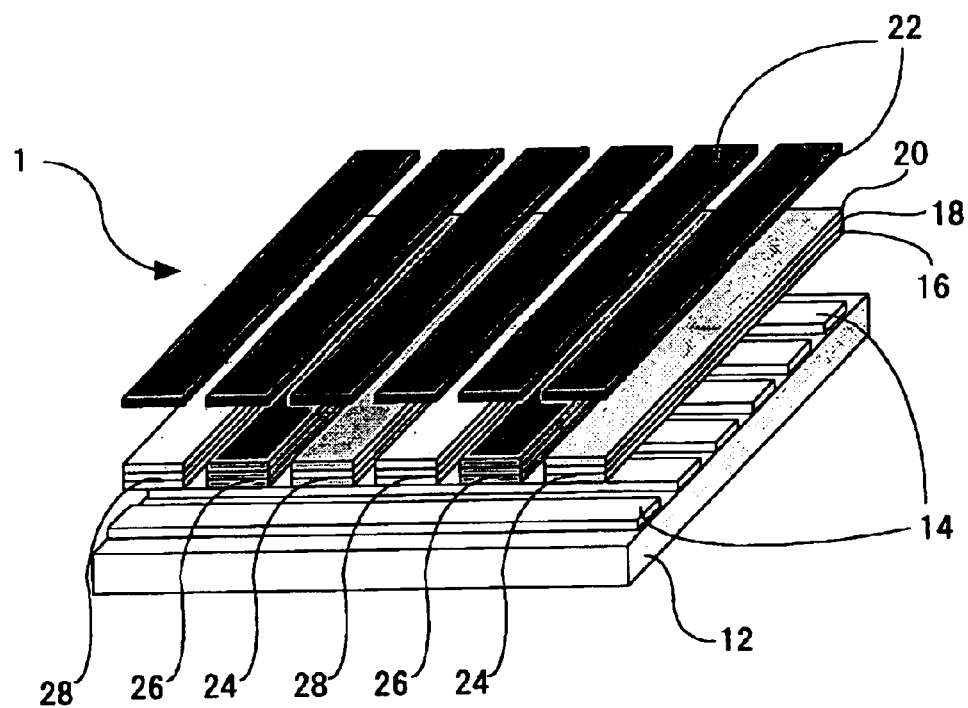
FIG. 2 is a schematic explanatory view describing an example of the construction of an organic EL display (passive matrix panel) of a passive matrix method.

The passive matrix panel has, for example, belt-like positive electrodes 14 (for example, ITO electrodes) arranged parallel to each other on a glass substrate 12. A belt-like organic thin film layer 24 for blue light emission, organic thin film layer 26 for green light emission and organic thin film layer 28 for red light emission are arranged sequentially in parallel and effectively perpendicular to the positive electrode 14 on the positive electrode 14, as shown in FIG. 2. This has negative electrodes 22 of identical shape on the organic thin film layer 24 for blue light emission, the organic thin film layer 26 for green light emission, and the organic thin film layer 28 for red light emission.

Figure 3:
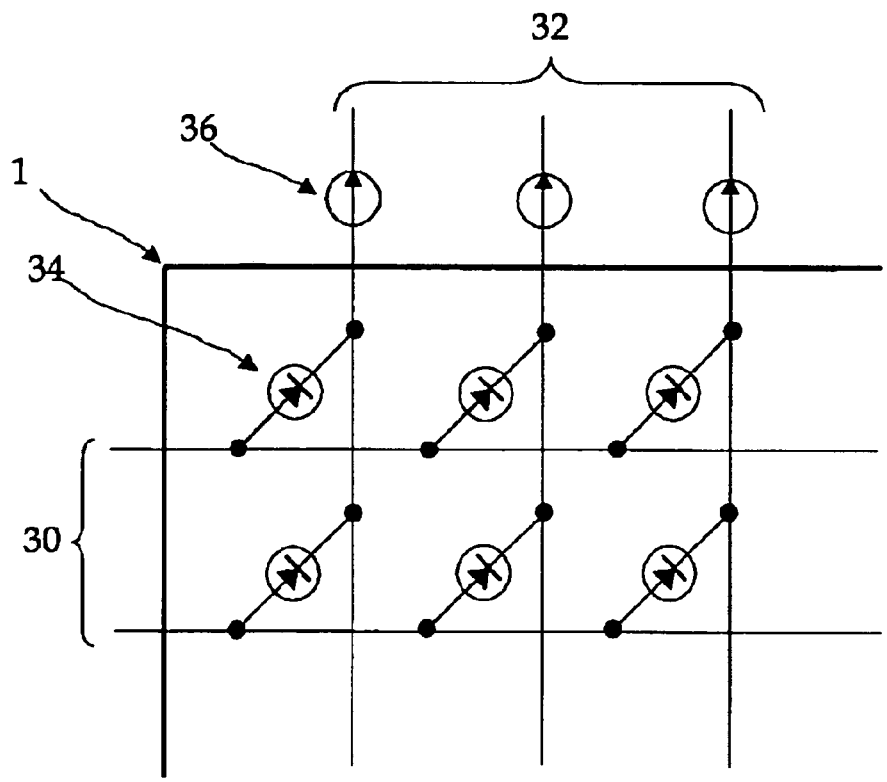
FIG. 3 is a schematic explanatory view describing an example of the circuit in an organic EL display (passive matrix panel) of the passive matrix method shown in FIG. 2.

In the passive matrix panel, positive electrode lines 30 comprising plural positive electrodes 14, and negative electrode lines 32 comprising plural negative electrodes 22, for example intersect effectively at right angles to form a circuit, as shown in FIG. 3. Each of the organic thin film layers 24, 26, 28 for blue light emission, green light emission and red light emission situated at each intersection point functions as a pixel, there being plural organic EL elements 34 corresponding to each pixel. In this passive matrix panel, when a current is applied by a constant current source 36 to one of the positive electrodes 14 in the positive electrode lines 30, and one of the negative electrodes 22 in the negative electrode lines 32, a current will be applied to the organic EL thin film layer situated at the intersection, and the organic EL thin film layer at this position will emit light. By controlling the light emission of this pixel unit, a full color picture can easily be formed.

Figure 4:
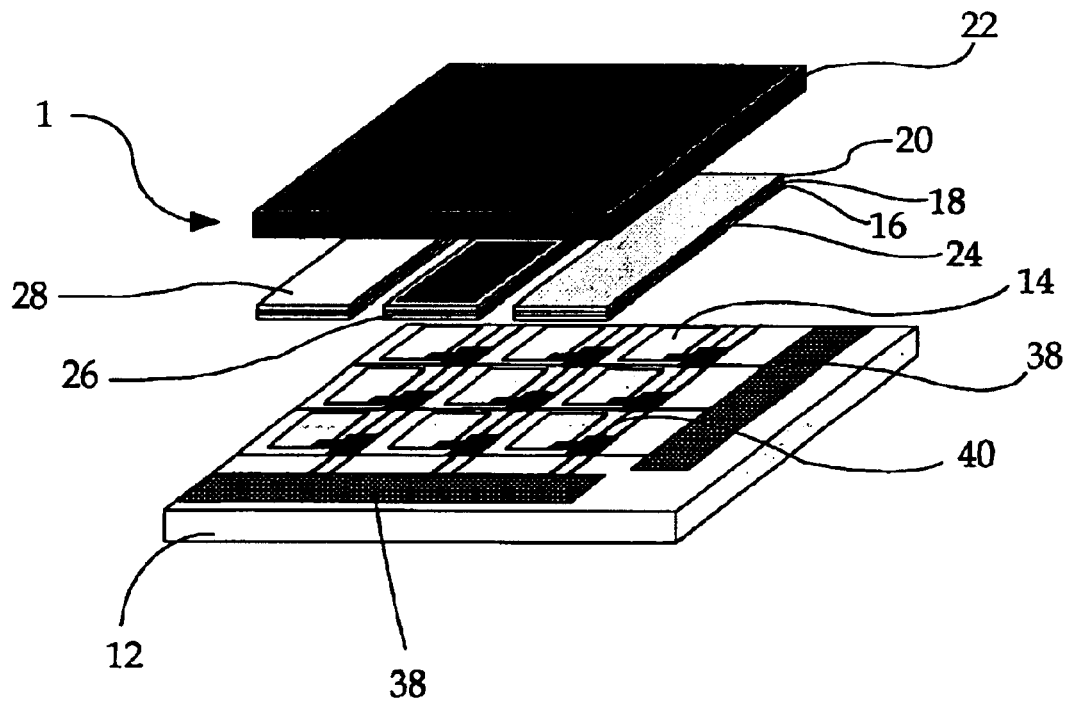
FIG. 4 is a schematic explanatory view describing an example of the construction of an organic EL display (active matrix panel) of an active matrix method.

In the active matrix panel, for example, scanning lines, data lines and current supply lines are arranged in a grid pattern on the glass substrate 12, as shown in FIG. 4. A TFT circuit 40 connected by the scanning lines forming the grid pattern is disposed in each square, and an positive electrode 14 (for example, ITO electrode) disposed in each square can be driven by the TFT circuit 40. The belt-like organic thin film layer 24 for blue light emission, organic thin film layer 26 for green light emission and organic thin film layer 28 for red light emission, are arranged sequentially in parallel. The negative electrodes 22 are also arranged so as to cover the organic thin film layer 24 for blue light emission, organic thin film layer 26 for green light emission and organic thin film layer 28 for red light emission. The organic thin film layer 24 for blue light emission, organic thin film layer 26 for green light emission and organic thin film layer 28 for red light emission respectively form a positive hole transporting layer 16, light-emitting layer 18 and electron transporting layer 20.

Figure 5:
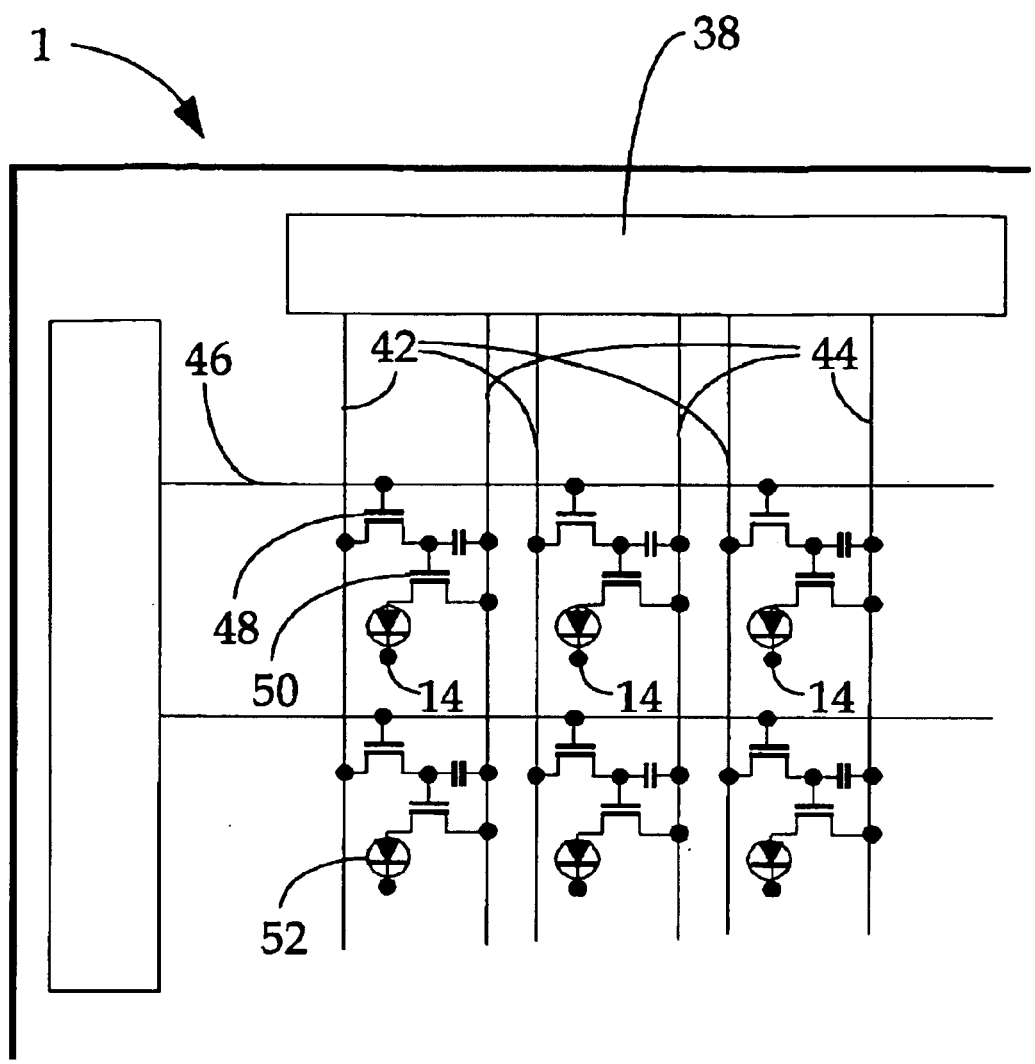
FIG. 5 is a schematic explanatory view describing an example of the circuit in an organic EL display (active matrix panel) of the active matrix method shown in FIG. 4.

In the active matrix panel, plural scanning lines 46 parallel to each other, plural data lines 42 parallel to each other and current supply lines 44 intersect effectively at right angles to form squares, as shown in FIG. 5, and a switching TFT 48 and drive TFT 50 are connected to each square to form a circuit. If a current is applied from a drive circuit 38, the switching TFT 48 and drive TFT 50 can be driven for each square. In each square, the organic thin film elements 24, 26, 28 for blue light emission, green light emission and red light emission function as a pixel. In this active matrix panel, if an electric current is applied from the drive circuit 38 to one of the scanning lines 46 arranged in the horizontal direction, and the electric current supply line 44 arranged in the vertical direction, the switching TFT 48 situated at the intersection is driven, the drive TFT 50 is driven as a result, and the organic EL element 52 at this position emits light. By controlling the light emission of the pixel unit, a full color picture can easily be formed.

The organic EL display of the present invention may be suitably used in various fields such as computers, on-vehicle display devices, field display devices, home apparatus, industrial apparatus, household electric appliances, traffic display devices, clock display devices, calendar display units, luminescent screens, audio equipment, and the like.

Hereafter, specific examples of the present invention will be described in detail, but it should be understood that the present invention is not limited to these examples.

EXAMPLE 1

—Synthesis of 1,3,6,8-tetra(N-carbazolyl)pyrene—

1,3,6,8-tetrabromopyrene was synthesized by the reaction of pyrene and bromine according to the description in Annalen der Chemie, Vol. 531, p. 81. Carbazole, potassium carbonate and copper powder were added to the 1,3,6,8-tetrabromopyrene, and were made to react with it at 250° C. for 30 hours. After diluting the reaction liquid with water, the reaction product was extracted with chloroform. Subsequently, it was purified according to a usual method to obtain 1,3,6,8-tetra(N-carbazolyl)pyrene expressed by the following structural formula (15).

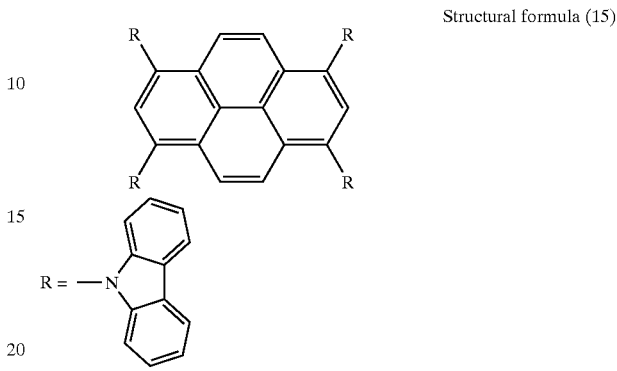

Structural formula (15)

—Manufacture of Organic EL Element—

A laminated-type organic EL element used in a light-emitting layer with 1,3,6,8-tetra(N-carbazolyl) pyrene as light-emitting material, was manufactured as follows. A glass substrate on which an ITO electrode was formed as an positive electrode was ultrasonically cleaned with water, acetone and isopropyl alcohol. After UV ozonization, using a vacuum vapor deposition device (degree of vacuum=$1 \times 10^{-6}$ Torr ($1.3 \times 10^{-4}$ Pa), substrate-temperature=room temperature), the TPD was formed as a positive hole injecting layer to cover this ITO electrode to a thickness of 20 nm. Next, the light-emitting layer of 1,3,6,8-tetra(N-carbazolyl) pyrene was coated by vapor deposition on this TPD positive hole injecting layer to a thickness of 20 nm. Next, BCP was coated by vapor deposition as a first electron transporting layer on this light-emitting layer to a thickness of 10 nm. Alq was then coated by vapor deposition on this first electron transporting layer to a thickness of 20 nm, and Al—Li alloy (Li content=0.5% by mass) was vapor deposited on the Alq second electron transporting layer as a negative electrode to a thickness of 50 nm. The organic EL element was manufactured by the above process.

When a voltage was applied to the ITO electrode (positive electrode) and Al—Li alloy (negative electrode) in the manufactured organic EL element, in this organic EL element, a blue light emission was observed at a voltage of 5V or higher, and at an applied voltage of 10V, a high purity blue light emission of light-emitting luminance 1450 cd/m$^2$ was observed.

EXAMPLE 2

An organic EL element was manufactured as in Example 1, except that it was formed by simultaneous vapor deposition with a ratio of 99 molecules of 4,4'-bis(9-carbazolyl)-biphenyl (CBP) (99 mols, 99% by mass) relative to one molecule of 1,3,6,8-tetra(N-carbazolyl)pyrene (1 mol, 1% by mass).

When a voltage was applied to the ITO electrode (positive electrode) and Al—Li alloy (negative electrode) in the manufactured organic EL element, in this organic EL element, a blue light emission was observed at a voltage of 5V or higher, and at an applied voltage of 10V, a high purity blue light emission of light-emitting luminance 1520 cd/m$^2$ was observed.

EXAMPLE 3

An organic EL element was manufactured as in Example 1, except that instead of forming the light-emitting layer, first electron transporting layer and second electron transporting layer separately, they were formed by coating vapor deposition of 1,3,6,8-tetra(N-carbazolyl)pyrene as electron transporting layer/light-emitting layer.

When a voltage was applied to the ITO electrode (positive electrode) and Al—Li alloy (negative electrode) in the manufactured organic EL element, in this organic EL element, a blue light emission was observed at a voltage of 6V or higher, and at an applied voltage of 10V, a high purity blue light emission of light-emitting luminance 1100 cd/m$^2$ was observed.

According to the present invention, the problems inherent in the related arts are solved, and an organic EL element having excellent light-emitting efficiency, light-emitting luminance and color purity of blue light, and a high performance organic EL display using this organic EL element, can be provided.

What is claimed is:

1. An organic EL element comprising:
    an organic thin film layer having a light-emitting layer between a positive electrode and a negative electrode;
    wherein the organic thin film layer comprises a 1,3,6,8-tetrasubstituted pyrene compound expressed by the following structural formula (1) as a light-emitting material

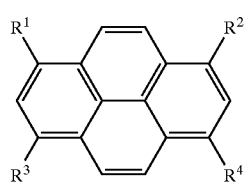

Structural formula (1)

in the structural formula (1), $R^1$ to $R^4$ may be identical or different, and are a substituent group expressed by the following structural formula (2),

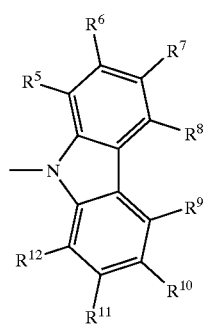

Structural formula (2)

in the structural formula (2), $R^5$ to $R^{12}$ may be identical or different, and is one of a hydrogen atom and a substituent group.

2. An organic EL element according to claim 1, wherein $R^5$ to $R^{12}$ are all hydrogen atoms.

3. An organic EL element according to claim 1, wherein the organic thin film layer comprises a light-emitting and electron transporting layer, and the light-emitting and electron transporting layer comprises the 1,3,6,8-tetrasubstituted pyrene compound expressed by the structural formula (1) as a light-emitting material.

4. An organic EL element according to claim 1, wherein the organic thin film layer comprises a light-emitting layer interposed between a positive hole transporting layer and an electron transporting layer, and the light-emitting layer comprises the 1,3,6,8-tetrasubstituted pyrene compound expressed by the structural formula (1) as a light-emitting material.

5. An organic EL element according to claim 4, wherein the light-emitting layer comprises a carbazole derivative expressed by the following structural formula (3):

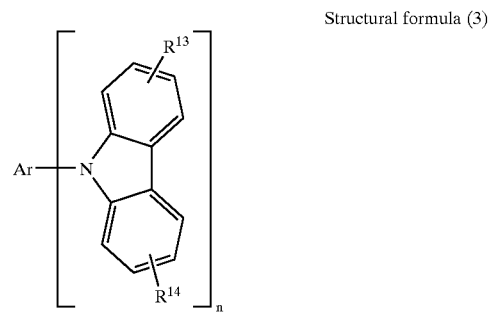

Structural formula (3)

in the structural formula (3), Ar represents a bifunctional group containing an aromatic ring, a trifunctional group containing an aromatic ring, a bifunctional group containing a heterocyclic aromatic group, or trifunctional group containing a heterocyclic aromatic group; $R^{13}$ and $R^{14}$ each independently represents a hydrogen atom, a halogen atom, an alkyl group, an aralkyl group, an alkenyl group, an aryl group, a cyano group, an amino group, an acyl group, an alkoxycarbonyl group, a carboxyl group, an alkoxy group, an alkylsulfonyl group, a hydroxy group, an amide group, or an aryloxy group, or an aromatic hydrocarbon ring or an aromatic heterocyclic ring; $R^{13}$ and $R^{14}$ may be further substituted by substituent groups.

6. An organic EL element according to claim 5, wherein the carbazole derivative is 4,4'-bis(9-carbazolyl)-biphenyl (CBP) expressed by the structural formula (4);

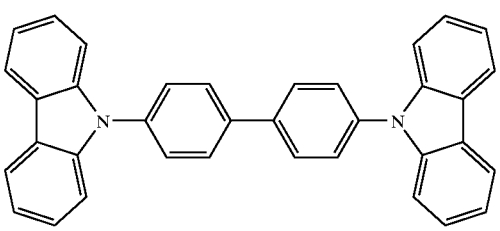

(4)

7. An organic EL element according to claim 1, wherein the organic thin film layer comprises a light-emitting layer interposed between a positive hole transporting layer and an electron transporting layer, and the light-emitting layer is formed by forming a film of the 1,3,6,8-tetrasubstituted pyrene compound expressed by the structural formula (1).

8. An organic EL element according to claim 7, wherein the electron transporting layer comprises an electron transport material in which wavelength at an optical absorption end of the electron transport material is shorter than wavelength at an optical absorption end of the 1,3,6,8-tetrasubstituted pyrene compound.

9. An organic EL element according to claim 8, wherein the electron transport material is at least one material selected from the group consisting of a phenanthroline derivative, an oxadiazole derivative and a triazole derivative.

10. An organic EL element according to claim 8, wherein the electron transport material is 2,9-dimethyl-4,7diphenyl- 1,10-phenanthroline (bathocuproine, BCP) expressed by the structural formula (10)

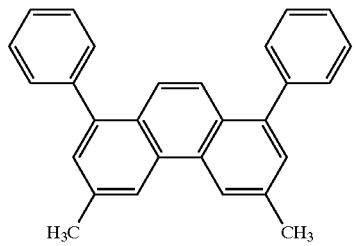

(10)

11. An organic EL element according to claim 1, wherein a peak wavelength of an EL light emission is 400 nm to 500 nm.

12. An organic EL element according to claim 1, wherein a thickness of the light-emitting layer is 5 nm to 50 nm.

13. An organic EL element according to claim 1, wherein the organic EL element is used for emitting a blue light.

14. An organic EL display comprising an organic EL element, wherein the organic EL element comprises:

an organic thin film layer having a light-emitting layer between a positive electrode and a negative electrode;

wherein the organic thin film layer comprises a 1,3,6,8-tetrasubstituted pyrene compound expressed by the following structural formula (1) as a light-emitting material

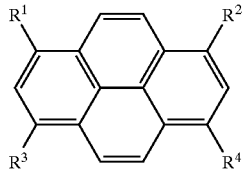

Structural formula (1)

in the structural formula (1), $R^1$ to $R^4$ may be identical or different, and are a substituent group expressed by the following structural formula (2),

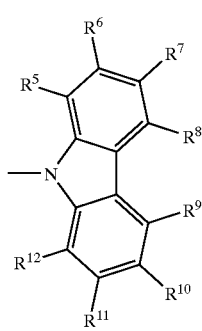

Structural formula (2)

in the structural formula (2), $R^5$ to $R^{12}$ may be identical or different, and is one of a hydrogen atom and a substituent group.

15. An organic EL display according to claim 14, wherein the organic EL display is one of a passive matrix display and an active matrix display.

* * * * *